United States Patent [19]
Yano

[11] Patent Number: 5,092,689
[45] Date of Patent: Mar. 3, 1992

[54] PIEZOELECTRIC DRIVER OF WIRE-DOT IMPACT PRINTER

[75] Inventor: Akio Yano, Tokyo, Japan

[73] Assignee: Fujitsu Limited, Kawasaki, Japan

[21] Appl. No.: 333,413

[22] Filed: Apr. 5, 1989

[30] Foreign Application Priority Data

Jul. 8, 1988 [JP] Japan .................................. 63-168894
Nov. 11, 1988 [JP] Japan .................................. 63-283897

[51] Int. Cl.⁵ ............................................. B41J 2/295
[52] U.S. Cl. .................................... 400/124; 400/157.1
[58] Field of Search ....... 400/124, 124 PZ, 157.1 PZ, 400/157.2; 101/93.05, 93.48

[56] References Cited

U.S. PATENT DOCUMENTS 4,695,174  9/1987  Gugel et al. ..................... 101/93.05

FOREIGN PATENT DOCUMENTS

| 54-27814 | 3/1979 | Japan | 400/124 |
|---|---|---|---|
| 8167 | 1/1982 | Japan | 101/93.05 |
| 215363 | 6/1982 | Japan | 400/124 |
| 57-191073 | 11/1982 | Japan | 400/124 |
| 193375 | 11/1982 | Japan | 400/124 |
| 188672 | 11/1983 | Japan | 400/124 |
| 97867 | 5/1985 | Japan | 400/124 |
| 62-56155 | 3/1987 | Japan | 400/124 |
| 279960 | 12/1987 | Japan | 101/93.05 |
| 292445 | 12/1987 | Japan | 101/93.05 |
| 292446 | 12/1987 | Japan | 400/124 PZ |
| 3967 | 1/1988 | Japan | 101/93.05 |
| 63-57256 | 3/1988 | Japan | 400/124 |

*Primary Examiner*—David A. Wiecking
*Attorney, Agent, or Firm*—Staas & Halsey

[57] ABSTRACT

A printing head includes a plurality of printing members constituting a dot matrix, and a plurality of actuators for driving the printing members, respectively. Each of the actuators comprises a resiliently movable member having one end to which the printing member is connected and the other end fixedly secured to a head base. An electro-distortion device can be used for exerting a displacement of the movable member, to enlarge the displacement at the one end and drive a printing member. The movable member is shaped substantially, between an actuating position and a fixing point, as one or more triangles, in a face of the flat material, in such a manner that the base and peak of the triangles are located substantially at the fixing and actuating positions, respectively.

6 Claims, 3 Drawing Sheets $$l_r' = \frac{l}{2}$$

$$\frac{L - l_r'}{l - l_r'} = \frac{2L - l}{l}$$

$$> \frac{3L - l}{2l}$$

(COMPARATIVE EXAMPLE)

$$\ell_r = \frac{\ell}{3}$$

$$\frac{L-\ell_r}{\ell-\ell_r} = \frac{3L-\ell}{2\ell}$$

PIEZOELECTRIC DRIVER OF WIRE-DOT IMPACT PRINTER

BACKGROUND OF THE INVENTION

1. Field of the Invention

This invention relates to a wire-dot printer, and more particularly, to a printing head of such a printer including actuating devices for driving dot-impact wires or rods comprising, for example, electro or magnetic-distortion devices. This invention also relates to an electro-distortion device advantageously used for such a printing head of the wire-dot printer.

2. Description of the Related Art

Recently, high-speed wire-dot printing heads have become more widely used, and accordingly, to drive dot-impact wires or rods of such a high-speed printing head, actuators comprising electro or magnetic-distortion devices have been developed and used instead of electromagnet type drive elements.

For example, page 92 of "NIKKEI (Japan Economic) MECHANICAL" issued on Mar. 12, 1984, suggests that a printing head including such electro-distortion devices can be used. This electro-distortion device is made by the steps of: preparing a plurality of green sheets made of piezo-electric ceramics, forming a metal paste film on one of the surfaces of each of the green sheets to form an inner electrode, and laminating and sintering the plurality of green sheets.

To make a printing head using such an actuating device, a means for effectively enlarging the very small displacements of such an actuating element is required when driving the dot-impact wires or rods.

SUMMARY OF THE INVENTION

An object of the present invention is to provide a wire-dot printer having a printing head including actuating elements for driving dot-impact wires or rods comprising, for example, electro or magnetic-distortion devices, capable of effectively enlarging the very small displacements of such actuating devices when driving the dot-impact wires of rods.

Another object of the present invention is to provide an electro-distortion device which can be reliably used for a high speed printing head of a wire-dot printer.

According to the present invention, there is provided a printing head which comprises: a head base; a plurality of printing members constituting a dot matrix, and a plurality of actuators for driving the printing members, respectively; each of the actuators comprising: a resiliently movable member having one free end to which the printing member is connected and the other end fixedly secured to the head base at a fixing point; the movable member having an actuating position in the vicinity of the fixing point such that a distance from the actuating position to the fixing point is much smaller than a distance from actuating position (A) to the free end; and an actuating device for exerting a displacement of the movable member at the actuating position (A) so that the displacement is enlarged at the one free end to drive the printing member; the movable member is a flat material extending substantially perpendicular to a direction of the displacement of the movable member; and the movable member is shaped substantially, between the actuating position (A) and the fixing point (B), as one or more triangles, in a face of the flat material, such that a base of each of the triangles is substantially located at the fixing point (B) and a peak thereof is substantially located at the actuating position (A).

In another aspect of the present invention, there is provided an electrodistortion device used as a piezo actuator, the device comprising: a plurality of sheets made of an electro-distortion material and laminated via electrodes, an insulation material enveloping the plurality of sheets and electrodes, a metal cover enveloping the insulation material, and means for energizing an electric voltage between the adjacent electrodes, so that the device generates a strain or displacement in a direction of lamination of the plurality of sheets when an electric power is applied between the adjacent electrodes.

DESCRIPTION OF THE PREFERRED EMBODIMENTS

Figure 1:
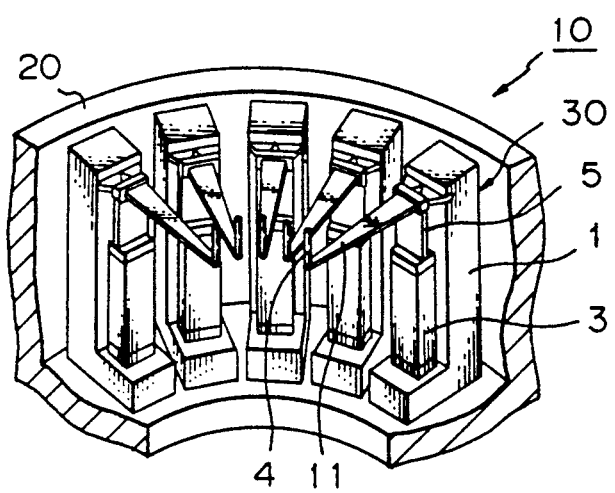
FIG. 1 is a partial perspective view of a printing head particularly an actuator for driving dot-impact wires or rods of a printer.
Figure 2A:
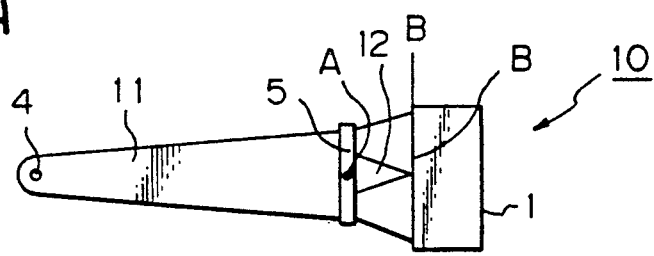
FIGS. 2A and 2B are a plan view and a front view of an actuating means for driving a dot-impact wire or rod.
Figure 2B:
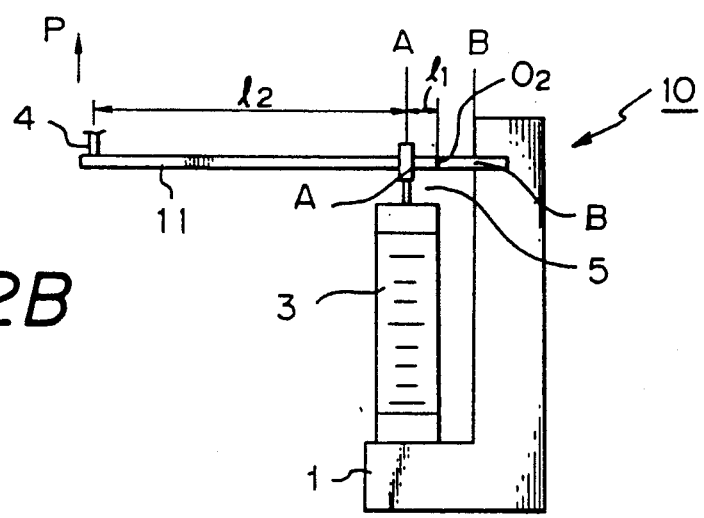

Referring now to FIGS. 1, 2A, and 2B, a printing head of a dot-impact printer according to the present invention is illustrated, wherein the printing head 10 comprises a cylindrical housing 20 and a plurality of actuators 30 arranged radially in the cylindrical housing 20.

Each of the actuators 30 comprises a base member 1, a movable member 11, and an actuating device (electro-distortion device) 3. The movable member 11 comprises a flat spring leaf made of an appropriate resilient material having one end rigidly secured to the base member 1 at a fixing position B and a free top end on which a dot-printing member (dot-printing pin or wire) 4 is mounted. A predetermined number of such dot-printing members cooperate to constitute a dot matrix. The width of the movable member 11, in the plan view of FIG. 2A, is gradually reduced from the fixing position B to the free end thereof throughout substantially the whole length thereof.

The actuating device 3 has one end rigidly secured to the base member 1 and the other end connected via a connecting member 5 to the movable member 11 at an actuating position A thereof. The actuating position A is relatively near to a position B at which the movable member 11 is fixed to the base member 1.

According to an embodiment of this invention, however, the shape of the movable member 11, as shown in the plan view of FIG. 2A, particularly from the actuating position A to the fixing position B, is such that two triangles or chevrons are laterally arranged side by side, each of the triangles having a base at the fixing position B and a peak at the actuating position A. In other words, the movable member 11 is provided, as shown in the plan view, with a triangular opening 12 having a base at the actuating position A and a peak at the fixing position B or in the vicinity thereof, and thus the above-mentioned two triangles are defined. In general, at least one such triangle or chevron is necessary. The remaining part of the movable member 11, as shown in the plan view of FIG. 2A, has a shape such that the width thereof is gradually reduced from the actuating position A to the free end thereof.

Figure 3A:
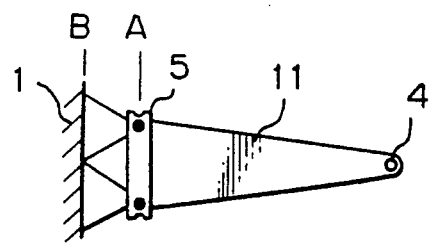
FIGS. 3A, 3B and 3C are views for illustrating the operations of the actuating means according to an embodiment of this invention.
Figure 3B:
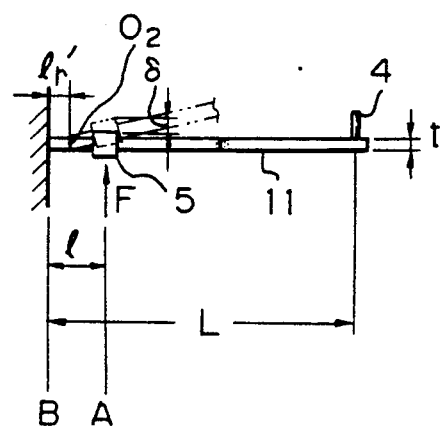

When printing, an electric power is supplied via a drive circuit (not shown) to the actuating device 3 for a predetermined time. In this case, the actuating device 3 generates an upward distortion of (perpendicular to the flat movable member 11), as shown in FIG. 2B, and imparts an upward displacement to, the movable member 11 at the actuating position A. The movable member 11 is thus resiliently deformed between the actuating position A and the fixing position B, so that the movable member 11 is bent in the clockwise direction in FIG. 2B (in the counterclockwise direction in FIG. 3B as shown by a dotted line) about the center ($O_2$) of rotation near to the fixing position B, as shown in FIGS. 3A and 3B. Due to this movement of the movable member 11, the dot-printing member 4 is moved upward as shown by an arrow P in FIG. 2B to perform a printing operation. The electric power supply to the actuating device 3 is stopped just before the completion of the printing operation, and thus, after a completion of printing, the movable member 2 is returned to the original position by the actuating device 3.

Figure 3C:
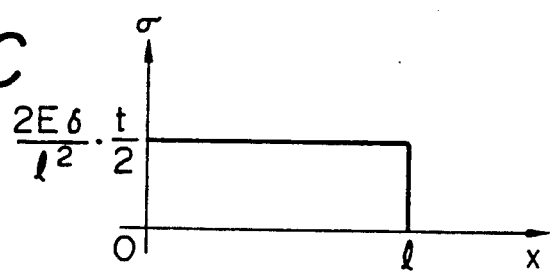
Figure 4A:
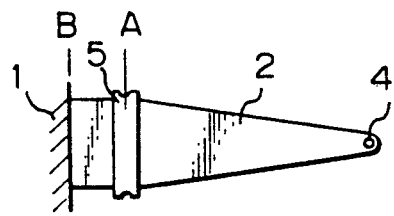
FIGS. 4A, 4B and 4C are views for illustrating the operations of a comparative example of an actuating means.
Figure 4B:
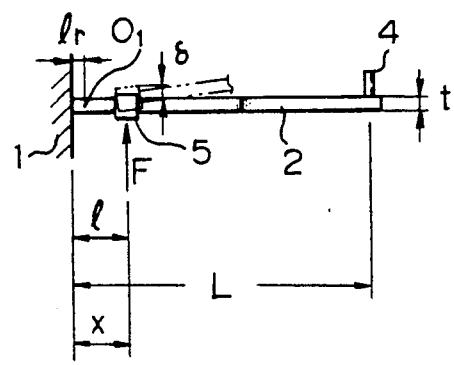
Figure 4C:
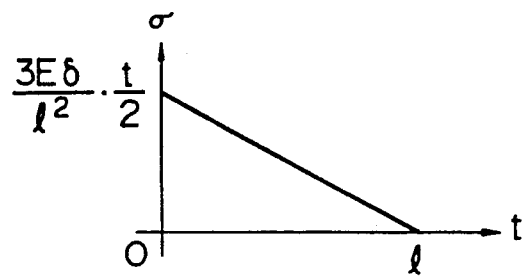

The operations of the actuating means according to this invention will now be described with reference to FIGS. 3A, 3B, and 3C, in comparison with a comparative example of a movable member 2 not having the triangular opening (12), as shown in FIGS. 4A, 4B, and 4C.

The width of the movable member 2 of the comparative example, as shown in the plan view of FIG. 4A, is substantially constant from the fixing position B to the actuating position A, and is gradually reduced from the actuating position A to the free top end on which the dot-printing member 4 is rigidly mounted.

If the movable member 2 of the comparative example were used, a tendency for the distribution of stress to be located in the vicinity of the fixing position B when the movable member 2 is resiliently deformed would occur, since the width of the movable member 2 is substantially constant from the fixing position B to the actuating position A. Namely, when the movable member 2 is resiliently deformed, a tendency for the center of rotation $O_1$ of the movable member 2 to be also located in the vicinity of the fixing position B would occur, and thus the rate of enlargement of displacement can be defined as:

$$\frac{l_1 + l_2}{l_1}$$

Therefore, if the length of the movable member 2 is shortened, to speed up the printing operation, the rate of enlargement of the displacement can not be increased to a satisfactory level.

According to the embodiment of the movable member 11 of this invention, since the movable member 11 has a triangular opening 12 as mentioned above, a distortion mode of the movable member 11 is changed in such a manner that an angle of distortion at the actuating position A is increased when the movable member 11 is resiliently deformed. This means that the distribution of stress, i.e., the center of rotation $O_2$ of the movable member 11, is shifted toward the actuating position A, and thus a rate of enlargement of the displacement defined as follows is increased:

$$\frac{l_1' + l_2}{l_1'}$$

Therefore, even if the length of the movable member 2 is shortened, to speed up the printing operation, the rate of enlargement of the displacement can be increased to a satisfactory level. Namely, a sufficient displacement or stroke of the printing member 4 required for printing can be obtained, and thus the speed of the printing operations can be increased.

In FIGS. 3A, 3B and 3C and FIGS. 4A, 4B and 4C, the symbols $l_r$, $l_r'$, $\delta$, l, L, and t represent the following definitions:

$l_r$: distance from the fixing position B to the center of rotation $O_1$ $l_r'$: distance from the fixing position B to the center of rotation $O_2$ $\delta$: displacement of the moving member at the actuating position A l: distance from the fixing position B to the actuating position A L: total length of the moving member, and t: thickness of the moving member.

As shown in the drawings, the center of rotation and the rate of enlargement of the displacement in typical cases of the embodiment of this invention and of the comparative example are as follows:

| | COMPARATIVE EXAMPLE | EMBODIMENT |
|---|---|---|
| center of rotation | $l_r = \frac{L}{3}$ | $l_r' = \frac{L}{2}$ |
| rate of enlargement of the displacement | $\frac{L - l_r}{1 - l_r} =$ | $\frac{L - l_r'}{1 - l_r'} =$ |
| | $\frac{3L - 1}{2l}$ | $\frac{2L - 1}{l} >$ |
| | | $\frac{3L - 1}{2l}$ |

As understood from the above description, according to the embodiment of the present invention, the center of rotation $O_2$ of the movable member 11 is shifted toward the actuating position A, and thus the rate of enlargement of the displacement defined is increased.

Also, as shown in FIGS. 3C and 4C, the distribution of stress in the comparative example is represented as an inclined line in such a manner that $\delta$ is 0 at the actuating position A and $$\frac{3E\delta}{l^2} \cdot \frac{t}{2}$$

at the fixing position B. According to the embodiment of the present invention, however, the distribution of stress is equal at any point between the fixing position B and the actuating position A and is represented as $$\frac{2E\delta}{l^2} \cdot \frac{t}{2}$$

which is smaller than the maximum stress occurring in the comparative example.

Therefore, according to the present invention, a high speed reliable printing head can be obtained, wherein the printing members are provided with a sufficient stroke length and the distribution of stress is not biased.

Figure 5:
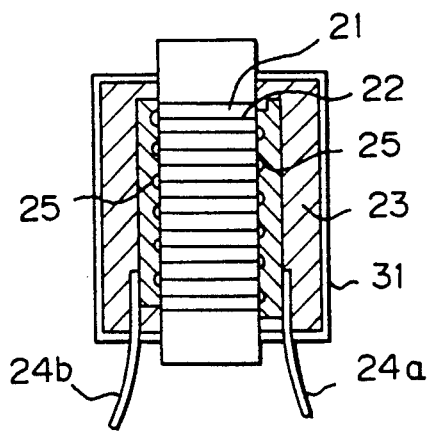
FIG. 5 is a cross-sectional view of an electro-distortion device used for driving dot-impact wires or rods of a printer.

FIG. 5 illustrates an electro-distortion device which can be used as an actuator for driving a dot-impact printing wire or rod in the printing head as mentioned above. This electro-distortion device comprises a plurality of sheets 21 made of an electro-distortion material, such as a piezo-electric ceramic, and laminated via electrodes 22. A first group of alternately arranged electrodes 22 are connected to a lead 24a and insulated from the second group of electrodes 22 by an insulation material 25 such as glass. The second group of electrodes 22, also arranged alternately, are connected to the other lead 24b and insulated from the first group of electrodes 22 in the same manner as above. The laminated sheets of an electro-distortion material 21 and the electrodes 22 are enveloped by an insulation resin material 23, such as an epoxy resin.

According to the present invention, the insulation resin material 23 is also enveloped by a metal cover 31. This metal cover 31 can be formed by vaporizing an appropriate metal, such as aluminum, onto the insulation resin material 23, and thus prevents an ingress of moisture inside the electro-distortion device, due to the high moisture proof characteristic of the metal cover 31. Also, the insulation resin material 23 prevents a short-circuit between the adjacent electrodes 22 caused by the metal cover 31. Therefore, the electrodes 22 are not electrically connected to each other due to, for example, a migration effect, even if in a moist environment, whereby the reliability of the electro-distortion device is improved.

I claim:

1. A printing head comprising:
    a head base;
    a plurality of printing members forming a dot matrix; and
    a plurality of actuators, respectively, operatively connected to said plurality of printing members, for driving said printing members, each of said actuators comprising:
        a resiliently movable member having a first end to which said printing member is connected and a second end fixedly secured to said head base at a fixing position, said movable member having an actuating position in the vicinity of said fixing position such that a distance from said actuating position to said fixing position is much smaller than a distance from said actuating position to said first end; and
        an electro-distortion device, operatively connected to said moveable member, for providing a displacement of said movable member at said actuating position so that said displacement is enlarged at said first end to drive said printing member,
        said movable member being a flat material extending substantially perpendicular to a direction of displacement of said movable member, said movable member located between said actuating position and said fixing position and shaped as one or more triangles, in a face of said flat material, such that a base of each of said one or more triangles is located substantially at said fixing position and a peak thereof is located substantially at said actuating position.

2. A printing head as set forth in claim 1, wherein a width of said movable member in said face of said flat material is gradually reduced from said fixing position to said first end to which said printing member is connected.

3. A printing head as set forth in claim 1, wherein said electro-distortion device has a first end rigidly connected or mounted on said base of said printing head and a second end connected to said movable member at said actuating position.

4. A printing head as set forth in claim 1, wherein said electro-distortion device comprises:
    a plurality of sheets made of an electro-distortion material and laminated via electrodes;
    an insulation material enveloping said plurality of sheets and electrodes; and
    means for energizing an electric voltage between adjacent electrodes, so that said device generates a strain or displacement in a direction of lamination of said plurality of sheets when an electric power is supplied between said electrodes.

5. A printing head as set forth in claim 4, wherein said electro-distortion device comprises a metal cover enveloping said insulation material.

6. A printing head as set forth in claim 1, wherein said movable member, located between said actuating position and said fixing position, is shaped substantially as two or more triangles.

* * * * *